United States Patent [19]
Hongu et al.

[11] 3,968,453
[45] July 6, 1976

[54] GAIN CONTROL CIRCUIT

[75] Inventors: Masayuki Hongu, Komae; Tsutomu Niimura, Tokyo, both of Japan

[73] Assignee: Sony Corporation, Tokyo, Japan

[22] Filed: Dec. 2, 1974

[21] Appl. No.: 528,935

[30] Foreign Application Priority Data
Dec. 1, 1973 Japan............................ 48-135093
May 9, 1974 Japan............................ 49-51565

[52] U.S. Cl. .............................. 330/29; 330/30 D
[51] Int. Cl.² ........................................ H03G 3/30
[58] Field of Search .......................... 330/29, 30 D

[56] References Cited
UNITED STATES PATENTS
2,878,380  3/1959  Holmes ........................... 330/29 X
3,764,931  10/1973  Waku et al. ....................... 330/29

*Primary Examiner*—R. V. Rolinec
*Assistant Examiner*—Lawrence J. Dahl
*Attorney, Agent, or Firm*—Lewis H. Eslinger; Alvin Sinderbrand

[57] ABSTRACT

A signal to be controlled is applied to the base of an emitter-follower input transistor, the emitter of which is connected to an input terminal of a differential amplifier. This input terminal of the amplifier is connected by a diode to a controllable current source so that the base current of the differential amplifier input transistor is controlled. A constant current source is connected to the common emitter circuit of the differential amplifier, and the gain of the circuit is determined by the ratio of current in the latter source to current in the controllable source. A current conducting circuit, such as, an emitter load resistor, is connected to the emitter of the input transistor to hold the output impedance thereof at a substantially constant low value inspite of changes in the current of the controllable current source. Maximum gain of the circuit may be determined by separating the controllable current source into a controllable portion and a fixed portion in parallel so that the minimum current is at least as great as the current of the fixed portion. This limits the maximum circuit gain by limiting the maximum ratio of fixed current to controllable current. A fixed voltage source connected to the common circuit point between the controllable current source and the diode assures that the gain of the circuit will not fall below a selected minimum value.

4 Claims, 2 Drawing Figures

GAIN CONTROL CIRCUIT

BACKGROUND OF THE INVENTION

1. Field of the Invention

This invention relates to gain control circuits and particularly to an improved gain control circuit in which the dynamic range thereof is independent of the control voltage applied thereto.

2. The Prior Art

Many types of gain control circuits have been proposed, each of which has some advantages. When a circuit having certain advantages is installed in an appropriate system, it may be required to operate under circumstances for which it is not particularly suited.

One type of gain control circuit proposed heretofore, includes an input transistor, the emitter of which is connected to the base of one of the transistors of a differential amplifier. The common circuit point between the emitter of the input transistor and the base of the transistor to which it is connected is further connected by a diode to a first controllable current source. The common emitter circuit of the transistors of the differential amplifier is connected to a second controllable current source, and the gain of this type of control circuit is approximately determined by the ratio of current in the second current source to the current in the first current source.

That type of gain control circuit also has some disadvantages. When the current of the first current source is reduced to a small value to make the gain of the circuit large, the output impedance of the input transistor increases. As a result, the gain of the circuit is changed more than is expected.

SUMMARY OF THE INVENTION

The gain control circuit of the present invention includes an input transistor that receives the input signal at its base and has its emitter connected to the base of a first transistor of a differential amplifier. The emitters of the first transistor and a second differentially connected transistor of the differential amplifier are connected to ground by way of a constant current circuit. A diode connects the base of the first transistor of the differential amplifier to a controllable current source, but in order to overcome the defects of the aforementioned prior art circuit conducting, a current circuit, such as an emitter load resistor, is connected to the emitter of the input transistor to maintain the output impedance of that transistor at a predetermined relatively low value.

The maximum gain of the circuit can be limited by separating the controllable current source into two sections, one of which produces a current that can be controlled and the other of which produces a constant current in parallel with the controllable portion. This limits the minimum value of the current from the controllable current source to a value at least as great as the current from the constant current section. The minimum gain of the gain control circuit may be automatically determined by a fixed voltage source connected to the junction of the diodes and the controllable current source.

DETAILED DESCRIPTION OF THE PREFERRED EMBODIMENTS

Figure 1:
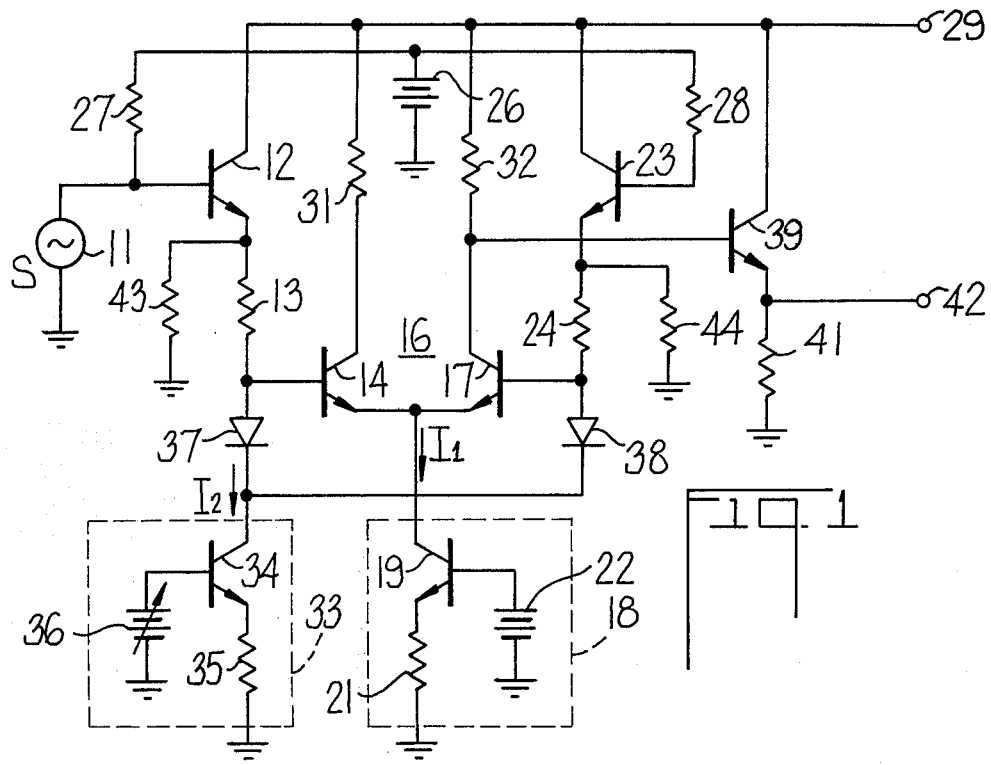
FIG. 1 is a schematic circuit diagram of one embodiment of the invention.

FIG. 1 shows a gain control circuit responsive to a signal voltage S from a source 11. This source is connected between ground and the base of an input transistor 12 that has a resistor 13 connected to its emitter. The other terminal of the resistor 13 is connected to the base of a first transistor 14 of a differential amplifier 16 that includes the transistor 14 and a second transistor 17. The emitters of the transistors 14 and 17 are connected directly together and are connected to ground through a constant current source 18 comprising a transistor 19, a resistor 21 connected in series with the emitter-collector circuit of the transistor 19, and a direct voltage bias source 22.

In order to balance the circuit, another transistor 23 corresponding to the transistor 12 may be included. The emitter of the transistor 23 is connected by way of a resistor 24 to the base of the transistor 17. A base bias voltage source 26 is connected to the base of the transistor 12 by a resistor 27 and to the base of the transistor 23 by a resistor 28. The collectors of the transistors 12 and 23 are both connected to a power supply terminal 29, and the collectors of the differential amplifier transistors 14 and 17 are also connected to the terminal 29 through load resistors 31 and 32, respectively.

A controllable current source 33 is provided to control the gain of the circuit. This current source comprises a transistor 34, a resistor 35 connected in series with the emitter-collector circuit of the transistor 34, and a controllable base bias voltage source 36. The resistor 35 is connected to ground, and the collector of the transistor 34 is connected to the bases of the transistor 14 and 17 by variable impedance devices, such as diodes 37 and 38, respectively.

The output terminal of the differential amplifier 16 is the collector of the transistor 17 and this is connected to the base of an output transistor 39 operating as an emitter-follower. The transistor 39 has an emitter load resistor 41, and an output terminal 42 is connected to the emitter of the transistor 39.

According to the present invention, further current circuits shown as resistors 43 and 44 are connected between ground and the respective emitters of the transistors 12 and 23.

The operation of the circuit will now be described. The transistor 12 converts the input signal voltage S from the source 11 to a signal current applied to the base of the transistor 14 and to the anode of the diode 37. The input impedance of the transistor 14 is constant since the current of the source 18 is held constant, but the impedance of the diode changes in response to the current of the source 33. As a result, the total gain of the circuit is proportional to the ratio of the current $I_1$ to $I_2$, where $I_1$ is the current that flows through the source 18 and $I_2$ is the controllable current of the source 33. Thus, the smaller the current $I_2$, the greater the gain of the circuit, and vice versa. Even though the current $I_2$ is reduced to a very small value so as to make the gain of the circuit a maximum, the output impedance of the transistor 12 as measured at the emitter thereof is held at a substantially constant, low value since the current circuit 43 guarantees the minimum current that flows through the emitter of the transistor 12. If the current circuit 43 is an emitter load resistor, as shown, its impedance is much smaller than the effective impedance of the controllable current source 33. Therefore, most of the emitter current of the transistor 12 flows through the current circuit 43, and changes in the current $I_2$ do not substantially affect the output impedance of the transistor 12. This avoids the large increase that would otherwise take place in the output impedance of the transistor 12 if there were no current circuit 43 and if the current $I_2$ through the circuit 33 were made very small.

According to the circuit in FIG. 1, the dynamic range of variation of output voltage of the differential amplifier 16, that is, the maximum voltage across the load 32, is basically determined by the current $I_2$ of the source 33. The gain control circuit is especially suitable as an automatic gain control circuit to supply an output signal having a relatively constant value. For this purpose the variable voltage source 36 may be replaced by a detected control signal obtained by measuring the amplitude of the output signal at the terminal 42.

The dynamic range of the differential amplifier 16 must be properly designed, taking into account the fact that the noise of a transistor junction is proportional to the current through it, and the bias requirements of the transistor 39. It is also necessary to recognize that increasing the current through the source 18 excessively causes a deterioration of the signal-to-noise ratio. The extra power dissipated due to increasing the current is, therefore wasted, since it is not used beneficially.

Figure 2:
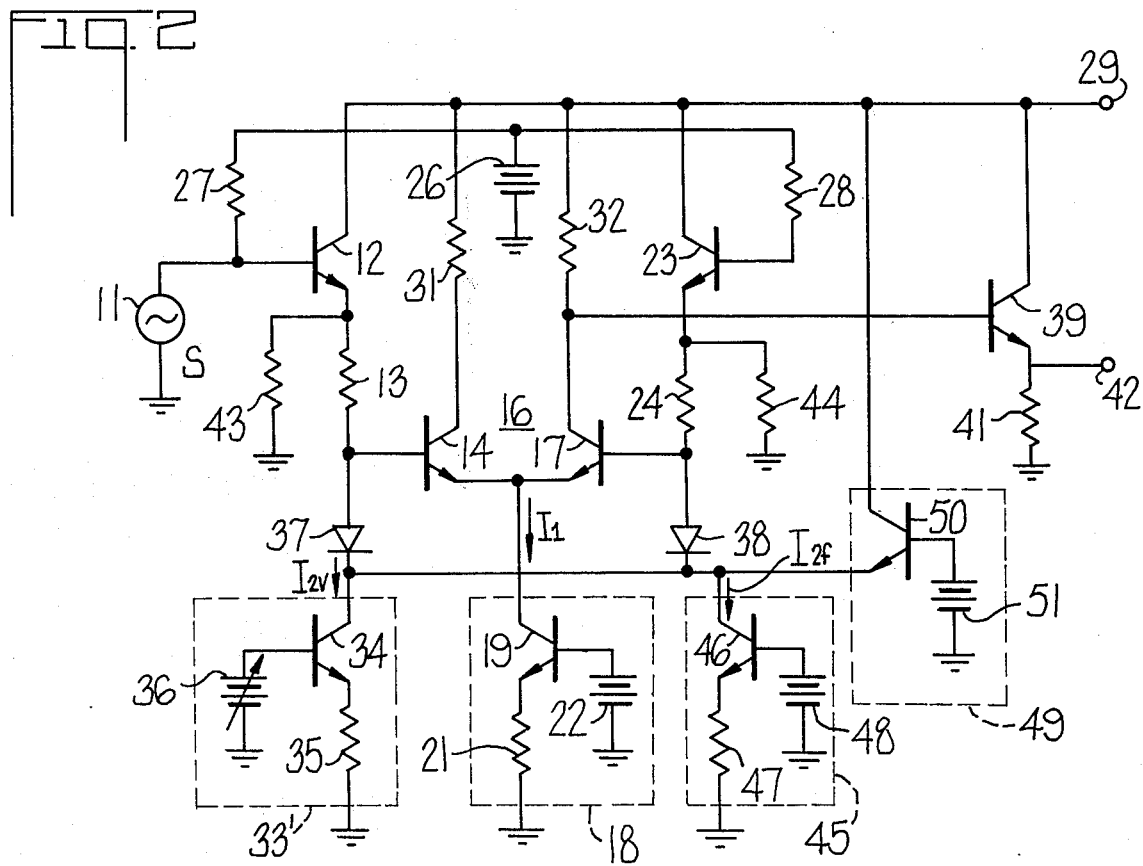
FIG. 2 is a schematic circuit diagram of a modified embodiment of the invention.

In the embodiment in FIG. 2 the controllable current source 33 is separated into two sections 33' and 45. The section 33' is indicated as including the transistor 34 and the resistor 35 along with the voltage source 36. The section 45 includes a transistor 46, a resistor 47, and a fixed base bias voltage source 48. The sections 33' and 45 are connected in parallel with each other so that the current $I_2$ of FIG. 1 is divided into a variable portion $I_{2v}$ and $I_{2f}$. The total current $I_2$, therefore, cannot be less than the value of $I_{2f}$, and this fixed current $I_{2f}$ determines the maximum gain of the circuit.

The circuit in FIG. 2 also includes a fixed voltage source 49 that includes a transistor 50 and base bias voltage source 51. The collector of the transistor 50 is connected to the power supply terminal 29 and the emitter of the transistor 50 is connected to the common circuit point between the diodes 37 and 38 and the collectors of the transistors 34 and 44.

The fixed voltage source 49 maintains the collector voltage of the transistors 34 and 46 at a fixed value so that the controllable current of the source 33' is limited. As a result, the maximum current that can flow through the diodes 37 and 38 is controlled by the voltage source 49. This source also serves to protect the transistor 34 of the variable current source 33' from breaking down when the power supply is turned on.

It will be obvious to those skilled in the art that modifications may be made in the circuit and that the invention is not limited to the specific embodiments shown. For example, the input signal S may be applied to the base of the transistor 23 in addition to being applied to the base of the transistor 12, but if it is applied to the base of the transistor 23, it must be in the opposite polarity. In addition, the current circuits 43 and 44 may be constant current circuits instead of simply resistors. Still further modifications may be made within the true scope of the invention as defined by the following claims.

What is claimed is:

1. A gain control circuit comprising:
   a differential amplifier including first and second differentially connected transistors, a base input circuit connected to the base of at least said first transistor and an output circuit;
   an input transistor;
   an impedance connecting the emitter of said input transistor to the base input circuit of the differential amplifier;
   an input signal voltage source connected to the base of said input transistor;
   a constant current source connected in series with the collector-emitter paths of said first and second differentially connected transistors between a power supply source and ground;
   a controllable current source;
   variable impedance means connecting said controllable current source to said base input circuit of said differential amplifier, the impedance value of said variable impedance means being controlled as a function of the current of said controllable current source so that the gain of said differential amplifier is determined by the ratio of the current of said constant current source to said current of the controllable current source; and
   current conducting circuit means connected to said emitter of said input transistor to carry part of the emitter current of said input transistor and thereby maintain a substantially low output impedance of said input transistor, as measured at said emitter thereof, even when said current of the controllable current source is reduced to a substantially small value for maximum gain of said differential amplifier.

2. The gain control circuit of claim 1 in which said controllable current source comprises a first section producing a variable current and a second section connected in parallel with said first section and producing a substantially constant current, whereby the minimum current of said controllable current source is not less than the value of said substantially constant current of said second section.

3. The gain control circuit according to claim 1 comprising, in addition, a substantially fixed voltage source connected between said controllable current source and said variable impedance means to limit the current of said controllable current source and thereby determine the minimum gain of the differential amplifier.

4. The gain control circuit according to claim 1 comprising detecting means connecting said controllable current source to said output circuit, whereby said controllable current source is controlled by the signal from said output circuit.

* * * * *